US010825536B1

(12) United States Patent
Yang et al.

(10) Patent No.: US 10,825,536 B1
(45) Date of Patent: Nov. 3, 2020

(54) PROGRAMMABLE CIRCUITS FOR PERFORMING MACHINE LEARNING OPERATIONS ON EDGE DEVICES

(71) Applicant: QUALCOMM Incorporated, San Diego, CA (US)

(72) Inventors: Haining Yang, San Diego, CA (US); Periannan Chidambaram, San Diego, CA (US)

(73) Assignee: Qualcomm Incorporated, San Diego, CA (US)

(*) Notice: Subject to any disclaimer, the term of this patent is extended or adjusted under 35 U.S.C. 154(b) by 0 days.

(21) Appl. No.: 16/556,505

(22) Filed: Aug. 30, 2019

(51) Int. Cl.
| | |
|---|---|
| *G11C 17/14* | (2006.01) |
| *G11C 17/16* | (2006.01) |
| *G11C 17/18* | (2006.01) |
| *G06N 3/08* | (2006.01) |
| *G06N 20/00* | (2019.01) |
| *G11C 13/00* | (2006.01) |

(52) U.S. Cl.
CPC .............. *G11C 17/16* (2013.01); *G06N 3/08* (2013.01); *G06N 20/00* (2019.01); *G11C 13/0069* (2013.01); *G11C 17/18* (2013.01); *G11C 17/143* (2013.01)

(58) Field of Classification Search
CPC ..... G11C 17/143; G11C 17/146; G11C 17/16; G11C 29/787
See application file for complete search history.

(56) References Cited

U.S. PATENT DOCUMENTS

| 2011/0080765 A1* | 4/2011 | Groepl | ............... G11C 17/18 365/96 |
|---|---|---|---|
| 2019/0385049 A1* | 12/2019 | Yang | ............... G06N 3/0635 |

OTHER PUBLICATIONS

Liu C., et al., "Rescuing Memristor-based Neuromorphic Design with High Defects", DAC '17, Jun. 18-22, 2017, Austin, TX, USA, 6 pages.
Sze V., et al., "Efficient Processing of Deep Neural Networks: A Tutorial and Survey," arXiv, Aug. 13, 2017, 32 Pages.

* cited by examiner

*Primary Examiner* — Han Yang
(74) *Attorney, Agent, or Firm* — Patterson & Sheridan, L.L.P.

(57) ABSTRACT

Certain aspects of the present disclosure are directed to methods and apparatus for programming a device having one or more programmable circuits to implement, for example, a machine learning model. One example apparatus generally includes a plurality of word lines, a plurality of bit lines, and an array of programmable circuits. Each programmable circuit is coupled to a corresponding word line in the plurality of word lines and to a corresponding bit line in the plurality of bit lines and comprises: a main resistor coupled between the corresponding word line and the corresponding bit line, an auxiliary resistor, a fuse coupled in series with the auxiliary resistor, wherein the auxiliary resistor and the fuse are coupled between the corresponding word line and the corresponding bit line, and a programming circuit configured to selectively blow the fuse.

30 Claims, 8 Drawing Sheets

PROGRAMMABLE CIRCUITS FOR PERFORMING MACHINE LEARNING OPERATIONS ON EDGE DEVICES

FIELD OF THE DISCLOSURE

The present disclosure generally relates to artificial neural networks and, more particularly, to techniques and apparatus for performing machine learning operations on edge devices.

DESCRIPTION OF RELATED ART

An artificial neural network, which may be composed of an interconnected group of artificial neurons (e.g., neuron models), is a computational device or represents a method performed by a computational device. These neural networks may be used for various applications and/or devices, such as Internet Protocol (IP) cameras, Internet of Things (IoT) devices, autonomous vehicles, and/or service robots.

Individual nodes in the artificial neural network may emulate biological neurons by taking input data and performing simple operations on the data. The results of the simple operations performed on the input data are selectively passed on to other neurons. Weight values are associated with each vector and node in the network, and these values constrain how input data is related to output data. For example, the input data of each node may be multiplied by a corresponding weight value, and the products may be summed. The sum of the products may be adjusted by an optional bias, and an activation function may be applied to the result, yielding the node's output signal or "output activation." The weight values may initially be determined by an iterative flow of training data through the network (e.g., weight values are established during a training phase in which the network learns how to identify particular classes by their typical input data characteristics).

Different types of artificial neural networks exist, such as recurrent neural networks (RNNs), multilayer perceptron (MLP) neural networks, convolutional neural networks (CNNs), and the like. RNNs work on the principle of saving the output of a layer and feeding this output back to the input to help in predicting an outcome of the layer. In MLP neural networks, data may be fed into an input layer, and one or more hidden layers provide levels of abstraction to the data. Predictions may then be made on an output layer based on the abstracted data. MLPs may be particularly suitable for classification prediction problems where inputs are assigned a class or label. Convolutional neural networks (CNNs) are a type of feed-forward artificial neural network. Convolutional neural networks may include collections of artificial neurons that each have a receptive field (e.g., a spatially localized region of an input space) and that collectively tile an input space. Convolutional neural networks have numerous applications. In particular, CNNs have broadly been used in the area of pattern recognition and classification.

In layered neural network architectures, the output of a first layer of artificial neurons becomes an input to a second layer of artificial neurons, the output of a second layer of artificial neurons becomes an input to a third layer of artificial neurons, and so on. Convolutional neural networks may be trained to recognize a hierarchy of features. Computation in convolutional neural network architectures may be distributed over a population of processing nodes, which may be configured in one or more computational chains. These multi-layered architectures may be trained one layer at a time and may be fine-tuned using back propagation.

SUMMARY

Certain aspects of the present disclosure are directed to an apparatus on which machine learning models may be executed. The apparatus generally includes a plurality of word lines, a plurality of bit lines, and an array of programmable circuits. Each programmable circuit in the array is coupled to a corresponding word line in the plurality of word lines and a corresponding bit line in the plurality of bit lines. Each programmable circuit includes a main resistor coupled between the corresponding word line and the corresponding bit line, an auxiliary resistor, a fuse coupled in series with the auxiliary resistor, wherein the auxiliary resistor and fuse are coupled between the corresponding word line and the corresponding bit line, and a programming circuit configured to selectively blow the fuse.

Certain aspects of the present disclosure are directed to a method for programming a device having a plurality of word lines, a plurality of bit lines, and an array of programmable circuits. Each programmable circuit in the array of programmable circuits is coupled to a corresponding word line in the plurality of word lines and to a corresponding bit line in the plurality of bit lines. The method generally includes programming a programmable circuit in the array of programmable circuits by selectively blowing a fuse (e.g., using a programming circuit), wherein the fuse is coupled in series with an auxiliary resistor, the auxiliary resistor and the fuse are coupled between the corresponding word line and the corresponding bit line, and a main resistor is coupled between the corresponding word line and the corresponding bit line, and operating the device using the programmed programmable circuit.

Certain aspects of the present disclosure are directed to an apparatus for programming a device. The apparatus generally includes a plurality of word lines, a plurality of bit lines, an array of programmable circuits, means for programming a programmable circuit in the array of programmable circuits by selectively blowing a fuse using the means for programming, and means for operating the device using the programmed programmable circuit. The fuse is coupled in series with an auxiliary resistor, the auxiliary resistor and the fuse are coupled between the corresponding word line and the corresponding bit line, and a main resistor is coupled between the corresponding word line and the corresponding bit line.

Certain aspects of the present disclosure are directed to a non-transitory computer-readable medium comprising instructions that, when executed by at least one processor, cause the processor to perform operations for programming a device having a plurality of word lines, a plurality of bit lines, and an array of programmable circuits. The operation generally includes programming a programmable circuit in the array of programmable circuits by selectively blowing a fuse (e.g., using a programming circuit), wherein the fuse is coupled in series with an auxiliary resistor, the auxiliary resistor and the fuse are coupled between the corresponding word line and the corresponding bit line, and a main resistor is coupled between the corresponding word line and the corresponding bit line, and operating the device using the programmed programmable circuit.

Certain aspects of the present disclosure are directed to a method for programming a device to implement a machine learning model. The method generally includes receiving, at the device, a weight value of a trained machine learning model to be implemented on the programmable circuit, programming the programmable circuit by selectively decoupling one or more auxiliary resistors in the programmable circuit from being coupled in parallel with a main resistor, based on the weight value of the trained machine learning model, and operating the device using the programmed programmable circuit.

Certain aspects of the present disclosure are directed to a non-transitory computer-readable medium comprising instructions that, when executed by at least one processor, cause the processor to perform operations for programming a device having the processor and a programmable circuit to implement a machine learning model. The operations generally include receiving, at the device, a weight value of a trained machine learning model to be implemented on the programmable circuit, programming the programmable circuit by selectively decoupling one or more auxiliary resistors in the programmable circuit from being coupled in parallel with a main resistor, based on the weight value of the trained machine learning model, and operating the device using the programmed programmable circuit.

Certain aspects of the present disclosure are directed to an apparatus for programming a device to implement a machine learning model. The apparatus generally includes an array of programmable circuits, means for receiving, from a server, weight values of a trained machine learning model to be implemented on the array of programmable circuits, means for programming at least one programmable circuit in the array of programmable circuits by selectively decoupling one or more auxiliary resistors in the programmable circuit from being coupled in parallel with a main resistor, based on the weight values of the trained machine learning model, and means for operating the apparatus using the programmed programmable circuit means for receiving, at the device from a server, a weight value of a trained machine learning model to be implemented on the programmable circuit, means for programming the programmable circuit by selectively decoupling one or more auxiliary resistors in the programmable circuit from being coupled in parallel with a main resistor, based on the weight value of the trained machine learning model, and means for operating the device using the programmed programmable circuit.

Certain aspects of the present disclosure are directed to an apparatus for programming a device to implement a machine learning model. The apparatus includes an array of programmable circuits and at least one processor coupled to the array of programmable circuits. The at least one processor is generally configured to receive weight values of a trained machine learning model to be implemented on the array of programmable circuits, program at least one programmable circuit in the array of programmable circuits by selectively decoupling one or more auxiliary resistors in the programmable circuit from being coupled in parallel with a main resistor, based on the weight values of the trained machine learning model, and operate the apparatus using the programmed programmable circuit.

Other aspects, advantages, and features of the present disclosure will become apparent after review of the entire application, including the following sections: Brief Description of the Drawings, Detailed Description, and the Claims.

DETAILED DESCRIPTION

Certain aspects of the present disclosure provide methods and apparatuses for performing machine learning operations on a device having a programmable circuit.

With reference now to the Figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Example Artificial Neural Networks

Figure 1:
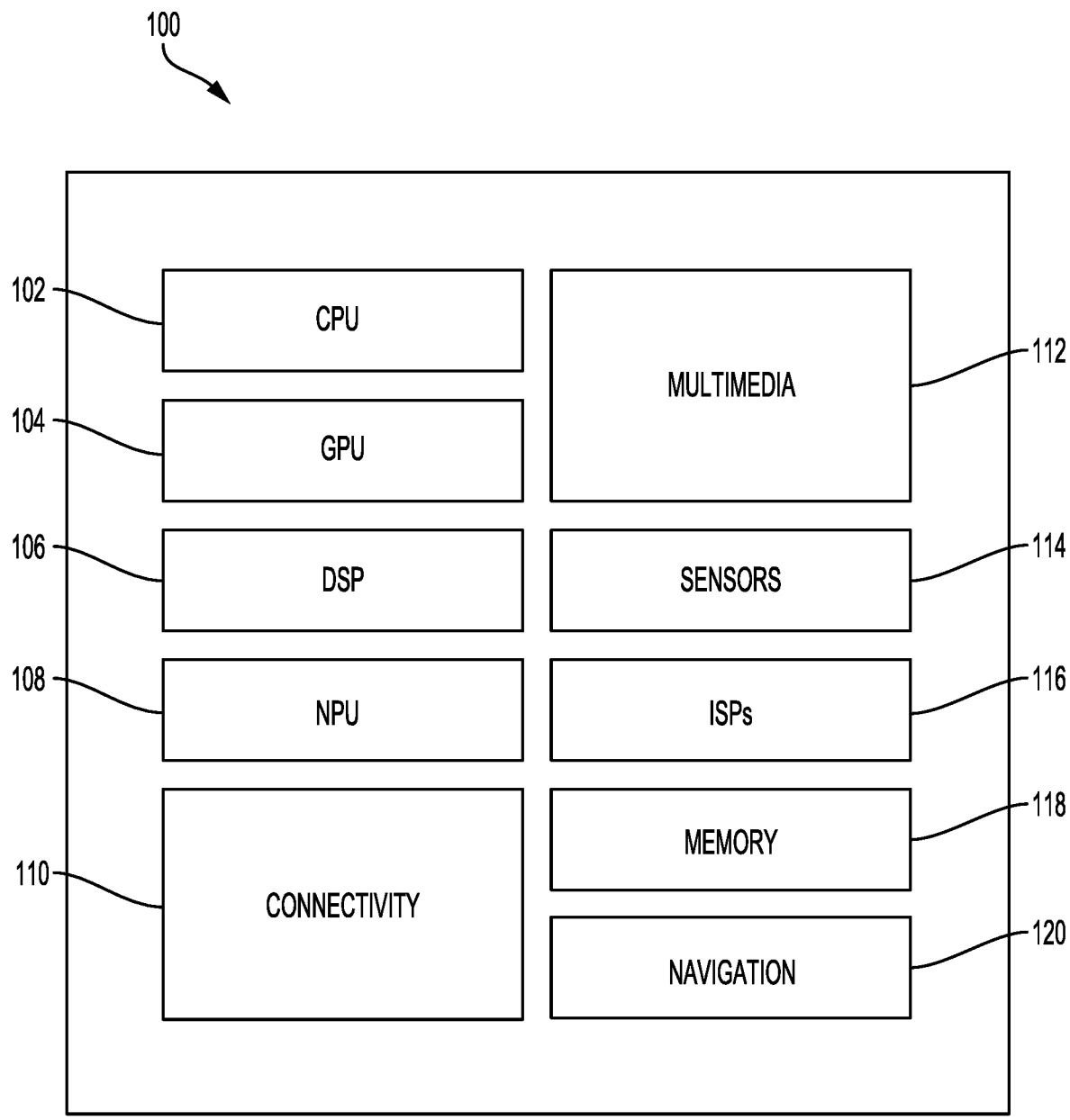
FIG. 1 illustrates an example implementation of a system-on-a-chip (SOC).

FIG. 1 illustrates an example implementation of a system-on-a-chip (SOC) 100, which may include a central processing unit (CPU) 102 or a multi-core CPU configured to perform a parallel Monte Carlo dropout function, in accordance with certain aspects of the present disclosure. Variables (e.g., neural signals and synaptic weights), system parameters associated with a computational device (e.g., neural network with weights), delays, frequency bin information, and task information may be stored in a memory block associated with a neural processing unit (NPU) 108, in a memory block associated with a CPU 102, in a memory block associated with a graphics processing unit (GPU) 104, in a memory block associated with a digital signal processor (DSP) 106, in a memory block 118, or may be distributed across multiple blocks. Instructions executed at the CPU 102 may be loaded from a program memory associated with the CPU 102 or may be loaded from a memory block 118.

The SOC 100 may also include additional processing blocks tailored to specific functions, such as a GPU 104, a DSP 106, a connectivity block 110, which may include fifth generation (5G) connectivity, fourth generation long term evolution (4G LTE) connectivity, Wi-Fi connectivity, USB connectivity, Bluetooth connectivity, and the like, and a multimedia processor 112 that may, for example, detect and recognize gestures. In one implementation, the NPU is implemented in the CPU 102, DSP 106, and/or GPU 104. The SOC 100 may also include a sensor processor 114, image signal processors (ISPs) 116, and/or navigation module 120, which may include a global positioning system.

The SOC 100 may be based on an ARM instruction set. In an aspect of the present disclosure, the instructions loaded into the CPU 102 may comprise code to search for a stored multiplication result in a lookup table (LUT) corresponding to a multiplication product of an input value and a filter weight. The instructions loaded into the CPU 102 may also comprise code to disable a multiplier during a multiplication operation of the multiplication product when a lookup table hit of the multiplication product is detected. In addition, the instructions loaded into the CPU 102 may comprise code to store a computed multiplication product of the input value and the filter weight when a lookup table miss of the multiplication product is detected.

The SOC 100 may further include an array of programmable circuits. As discussed in further detail below, each circuit in the array of programmable circuits may be a cell including a plurality of resistors. Each circuit may be programmed to selectively couple or decouple a main resistor with one or more auxiliary resistors to implement a weight parameter in a machine learning model. The array of programmable circuits may be updated to reflect new weight parameters for the machine learning model or may be reprogrammed to implement a different machine learning model, as needed.

SOC 100 and/or components thereof may be configured to perform a variety of machine learning tasks or deep learning tasks at an edge device, such as an autonomous motor vehicle (e.g., a self-driving car) or a mobile computing device. These edge devices may have limited computing resources but may operate in environments in which reduced latency and data communication costs are desired (e.g., in performing object recognition tasks from video data captured in real time, performing recognition tasks locally to minimize latency involved in providing data to a remote system for analysis, etc.). Further, these edge devices may have security constraints that may impose restrictions on how much data can be exposed outside of the edge device. By using an array of programmable circuits to implement a machine learning model or deep learning architecture, aspects of the present disclosure may allow for power efficient execution of machine learning functions on edge devices.

Deep learning architectures may perform an object recognition task by learning to represent inputs at successively higher levels of abstraction in each layer, thereby building up a useful feature representation of the input data. In this way, deep learning addresses a major bottleneck of traditional machine learning. Prior to the advent of deep learning, a machine learning approach to an object recognition problem may have relied heavily on human engineered features, perhaps in combination with a shallow classifier. A shallow classifier may be a two-class linear classifier, for example, in which a weighted sum of input values (e.g., input vector components) may be compared with a threshold to predict to which class the input belongs. Human engineered features may be templates or kernels tailored to a specific problem domain by engineers with domain expertise. Deep learning architectures, in contrast, may learn to represent features that are similar to what a human engineer might design, but through training. Furthermore, a deep network may learn to represent and recognize new types of features that a human might not have considered.

A deep learning architecture may learn a hierarchy of features. If presented with visual data, for example, the first layer may learn to recognize relatively simple features, such as edges, in the input stream. In another example, if presented with auditory data, the first layer may learn to recognize spectral power in specific frequencies. The second layer, taking the output of the first layer as input, may learn to recognize combinations of features, such as simple shapes for visual data or combinations of sounds for auditory data. For instance, higher layers may learn to represent complex shapes in visual data or words in auditory data. Still higher layers may learn to recognize common visual objects or spoken phrases.

Deep learning architectures may perform especially well when applied to problems that have a natural hierarchical structure. For example, the classification of motorized vehicles may benefit from first learning to recognize wheels, windshields, and other features. These features may be combined at higher layers in different ways to recognize cars, trucks, and airplanes.

Neural networks may be designed with a variety of connectivity patterns. In feed-forward networks, information is passed from lower to higher layers, with each neuron in a given layer communicating to neurons in higher layers. A hierarchical representation may be built up in successive layers of a feed-forward network, as described above. Neural networks may also have recurrent or feedback (also called top-down) connections. In a recurrent connection, the output from a neuron in a given layer may be communicated to another neuron in the same layer. A recurrent architecture may be helpful in recognizing patterns that span more than one of the input data chunks that are delivered to the neural network in a sequence. A connection from a neuron in a given layer to a neuron in a lower layer is called a feedback (or top-down) connection. A network with many feedback connections may be helpful when the recognition of a high-level concept may aid in discriminating the particular low-level features of an input.

Deep belief networks (DBNs) are probabilistic models comprising multiple layers of hidden nodes. DBNs may be used to extract a hierarchical representation of training data sets. A DBN may be obtained by stacking up layers of Restricted Boltzmann Machines (RBMs). An RBM is a type of artificial neural network that can learn a probability distribution over a set of inputs. Because RBMs can learn a probability distribution in the absence of information about the class to which each input should be categorized, RBMs are often used in unsupervised learning. Using a hybrid unsupervised and supervised paradigm, the bottom RBMs of a DBN may be trained in an unsupervised manner and may serve as feature extractors, and the top RBM may be trained in a supervised manner (on a joint distribution of inputs from the previous layer and target classes) and may serve as a classifier.

Deep convolutional networks (DCNs) are networks of convolutional networks, configured with additional pooling and normalization layers. DCNs have achieved state-of-the-art performance on many tasks. DCNs can be trained using supervised learning in which both the input and output targets are known for many exemplars and are used to modify the weights of the network by use of gradient descent methods.

DCNs may be feed-forward networks. In addition, as described above, the connections from a neuron in a first layer of a DCN to a group of neurons in the next higher layer are shared across the neurons in the first layer. The feedforward and shared connections of DCNs may be exploited for fast processing. The computational burden of a DCN may be much less, for example, than that of a similarly sized neural network that comprises recurrent or feedback connections.

Example Programmable Circuits for Performing Machine Learning Operations on Edge Devices Deep learning operations may typically be performed on high performance central processing units (CPUs) or specialized processors, such as tensor processor units (TPUs) or programmable graphics processing units (GPUs). Deep learning operations may be computationally expensive and memory intensive. Further, because of the computational expense of these operations, the processors on which these deep learning operations execute may consume a significant amount of power (e.g., over 200 watts of power). The power usage of these CPUs or specialized processors on which deep learning operations execute, however, may limit the ability to implement deep learning operations on various edge devices, such as motor vehicles or mobile phones.

Non-volatile memory (NVM) and memristors have been proposed for use in low energy machine learning applications. Memristors are generally memory devices that can change values stored in the memory devices by increasing or decreasing the resistance of a circuit. In a machine learning application, arrays of memristors have been proposed for implementing matrix-vector and/or matrix-matrix multiplication operations. For example, a high density crossbar array of memristors may be used in which a memristor connects a wordline and a bitline at each intersection of the array, such that an input vector of a set of voltages is input simultaneously to each of the wordlines in the array. In these examples, NVM may be used as synapses to scale signals, or weights used in a machine learning model. Learning may be performed through changes to the weights used in the machine learning model. Arrays of NVM elements and/or memristors may allow for in-memory computing (e.g., the performance of various logic operations in memory) and weight stationary data flow (e.g., performance of various operations without moving data in and out of memory, as opposed to multiply-and-accumulate operations in typical CPUs or GPUs which involve three memory read operations and one memory write operation), which may reduce energy utilization from moving data within the system. Because NVM and memristors may allow for power-efficient computing, NVM and memristors may be suitable for executing deep learning, or inference, applications on edge devices while leaving computationally expensive model training and development on remote servers.

However, memristors may have other properties that reduce the suitability of these devices for deployment in edge devices. For example, memristors, such as Resistive Random Access Memory (RRAM), phase change memory (PCM), or spin-transfer torque (STT) magnetic random access memory (MRAM), may have device-to-device variation created at manufacturing time and may have program current dependencies after programming. The standard deviation of a PCM conductance charge may exceed an average change. RRAM may need a large amount of power (e.g., in excess of 2.5 volts) for programming and may have large variations in resistance. Finally, STT MRAM may have size constraints that limit integration of STT MRAM with other circuits. For example, STT MRAM may be manufactured on a 28 nm process with large programming transistors and periphery circuitry, while other integrated circuits in an edge device (e.g., CPUs, GPUs, SOCs, etc.) may be manufactured on smaller lithography processes.

Additionally, other chip-to-chip variation may exist in semiconductor manufacturing. Variations may be generated from front-end-of-line (FEOL) devices used to pattern a semiconductor and/or back-end-of-line (BEOL) metal process variation. Because of device-to-device and manufacturing variation, it may be possible to train a limited number of chips having memristors for machine learning applications in the cloud; however, it may not be possible to train a large number of chips having memristors for machine learning applications on mobile devices. For example, device defects may result in one or more failed memristors, such as memristors being frozen in a high conductance ("stuck-on") or a low conductance ("stuck-off") state. Each chip may have a varying number of failed memristors due to device defects, which may cause variance in output for any given input across different chips implementing the same model. Finally, because NVM or memristor devices may use different manufacturing processes from volume manufacturing processes used in manufacturing other integrated circuits for edge devices (e.g., CPUs, GPUs, SOCs, etc.), integration of NVM or memristors into processors used in edge devices may be limited.

To allow for energy efficient machine learning operations on an edge device, aspects of the present disclosure provide a programmable circuit including an array of resistors that can be used to implement weight parameters of a trained machine learning model, such as a deep neural network. A computer system or cluster of computer systems remote from an edge device (e.g., dedicated servers or cloud computing systems) may train a machine learning model (e.g., a deep neural network) to determine synapse weights and biases and may provide the determined synapse weights and biases to an edge device, and the edge device can program the programmable circuit accordingly to implement the trained machine learning model. In some aspects, the programmable circuit may be tested for a specific task to determine if synapse weights and biases should be updated to meet a specification. Further, edge devices may be updated while deployed to execute new tasks or to reflect new learning derived by a remote computer system or cluster of computing systems.

By using programmable circuits including arrays of resistors for performing machine learning operations, aspects of the present disclosure may allow for the implementation of machine learning models on programmable circuits that approach the power efficiency and speed of a memristor-based chip. These programmable circuits may avoid the use of memristors and instead use components fabricated on existing process technology, which may allow for mass production of these programmable circuits. Further, by using conventional electrical components, chips may be fabricated with consistent properties (e.g., numbers of programmable resistors in an array), variability may be minimized across different chips, and the chips may be tuned to mitigate manufacturing variability from differences in metal wire resistance, transistor variation, and resistor variation. Further, the tunability of the programmable circuits, which allows for updates to synaptic weights and biases in the circuit, may allow for new learning capabilities to be deployed to edge devices in the field.

Figure 2:
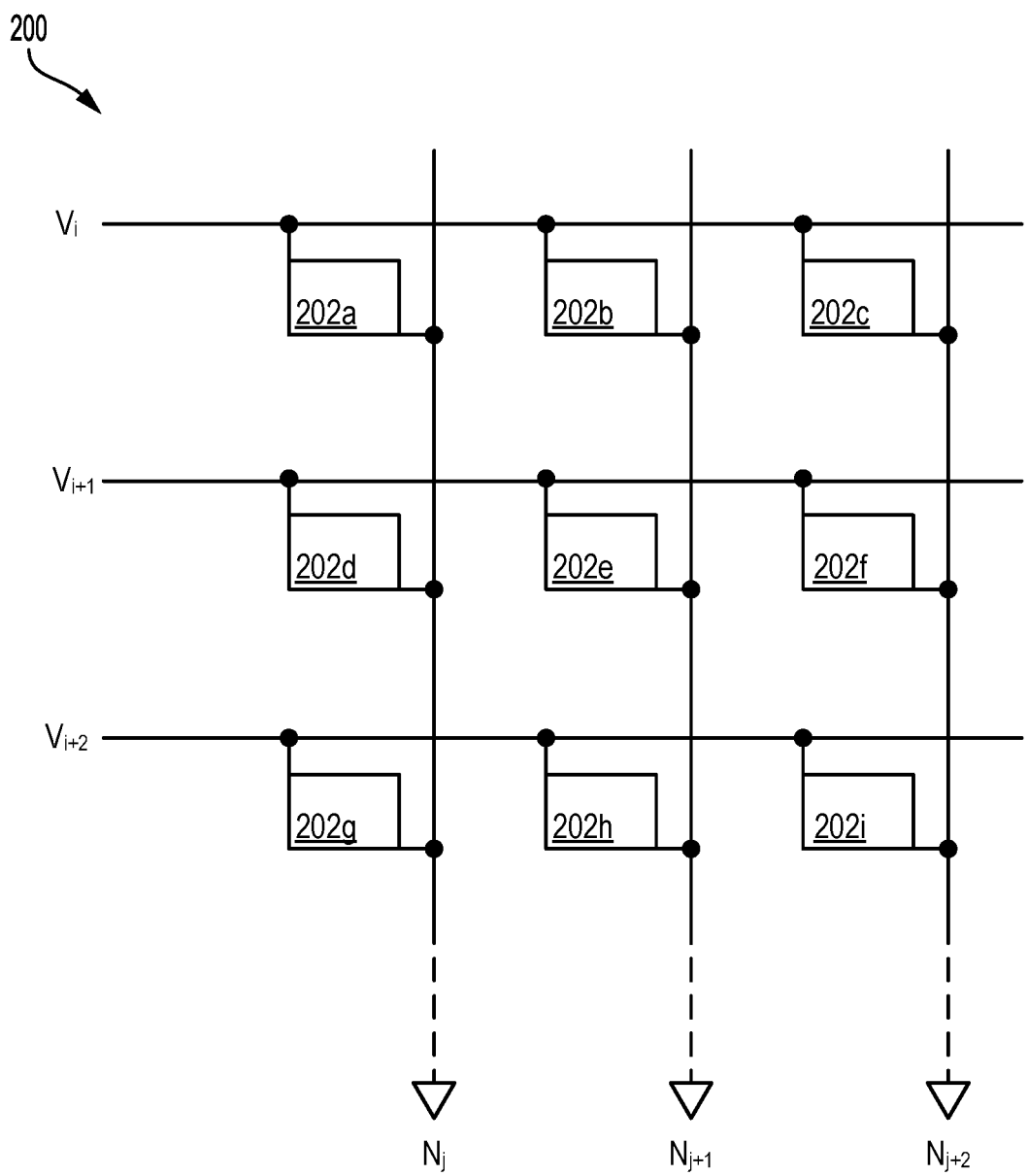
FIG. 2 illustrates an example array of programmable circuits that can be programmed to perform a machine learning operation, according to aspects of the present disclosure.

FIG. 2 illustrates an array 200 of programmable circuits which may be programmed to perform a machine learning operation, according to aspects of the present disclosure. As illustrated, array 200 may include a plurality of programmable circuits 202, which may correspond to programmable circuits 300 illustrated in FIGS. 3A and 3B. Array 200 may include a set of n input lines $V_i$, $V_{i+1}$, $V_{i+2}$, ..., $V_{i+n}$ and a set of m output lines $N_j$, $N_{j+1}$, $N_{j+2}$, ..., $N_{j+m}$, where n and m are positive integers. Input lines V may be wordlines through which analog inputs representing a feature vector are provided to array 200, and output lines N may be bitlines representing a product of a feature vector element and a synaptic weight represented by a resistance value of a programmable circuit 202 in array 200. Each programmable circuit 202 in array 200 may be positioned at an intersection of an input line V and an output line N such that each programmable circuit generates a value by processing a received voltage input (e.g., from an input line V) through a main resistor and any auxiliary resistors electrically coupled with the main resistor in parallel (e.g., auxiliary resistors for which a corresponding programmable fuse has not been blown). For example, as illustrated in FIG. 2, programmable circuits 202a, 202b, and 202c may be positioned at the intersections of input line $V_i$ and output lines $N_j$, $N_{j+1}$, and $N_{j+2}$, respectively, such that programmable circuits 202a, 202b, and 202c receive an input from input line $V_i$ for processing and generate outputs on respective output lines $N_j$, $N_{j+1}$, and $N_{j+2}$. Similarly, programmable circuits 202d, 202e, and 202f may be positioned at the intersections of input line $V_{i+1}$ and output lines $N_j$, $N_{j+1}$, and $N_{j+2}$, respectively, to process an input from input line $V_{i+1}$, programmable circuits 202g, 202h, and 202i may be positioned at the intersections of input line $V_{i+2}$ and output lines $N_j$, $N_{j+1}$, and $N_{j+2}$, respectively, to process an input from input line $V_{i+2}$, and so on.

Each programmable circuit 202 in array 200 may generate an output (e.g., a current output) as the combination of an input value passed through a main resistor of the programmable circuit 202 and an input value passed through one or more auxiliary resistors selectively coupled with the main resistor. The outputs generated by a plurality of programmable circuits may be combined (e.g., current summation) as the output of a single output line in array 200. For example, the outputs generated by programmable circuits 202a, 202d, and 202g may be combined into an output generated on output line $N_j$, the outputs generated by programmable circuits 202b, 202e, and 202h may be combined into an output generated on output line $N_{j+1}$, the outputs generated by programmable circuits 202c, 202f, and 202i may be combined into an output generated on output line $N_{j+2}$, and so on. Generally, the output generated on an output line N from each programmable circuit 202 may be a product of a feature vector element and a synaptic weight represented by a total programmable resistance of each programmable circuit on the output line. In generating an output through multiple programmable circuits 202, as discussed herein, multiply and accumulate operations may be integrated into array 200, which may reduce energy consumption during machine learning operations. For certain aspects, the combined current generated by the programmable circuits on a given output line N may be provided as an input analog signal to the next stage (e.g., another analog circuit). For other aspects, the combined bitline current may be used to charge a capacitor for generating output spikes. In this case, the capacitor may be discharged to produce a spike when the capacitor is triggered by any of various suitable techniques (e.g., a circuit triggering the spike when the capacitor voltage reaches a predetermined voltage). For still other aspects, the combined bitline current may be converted to a digital signal by an analog-to-digital converter (ADC).

In some aspects, array 200 may be tested after programmable circuits 202 in array 200 are programmed to verify that array 200 operates within specification (e.g., produces the expected results of a machine learning process for a given input). If array 200 does not produce the expected results (e.g., due to manufacturing variance or errors in one or more elements in a programmable circuit 202), then array 200 may be further tested to identify one or more programmable circuits 202 in the array that are out of specification and causing array 200 to produce an incorrect result. The programmable fuses in the identified one or more programmable circuits 202 may be blown so as to adjust the synaptic weight of the programmable circuit 202 or to effectively remove the identified one or more programmable circuits 202 from array 200.

Figure 3A:
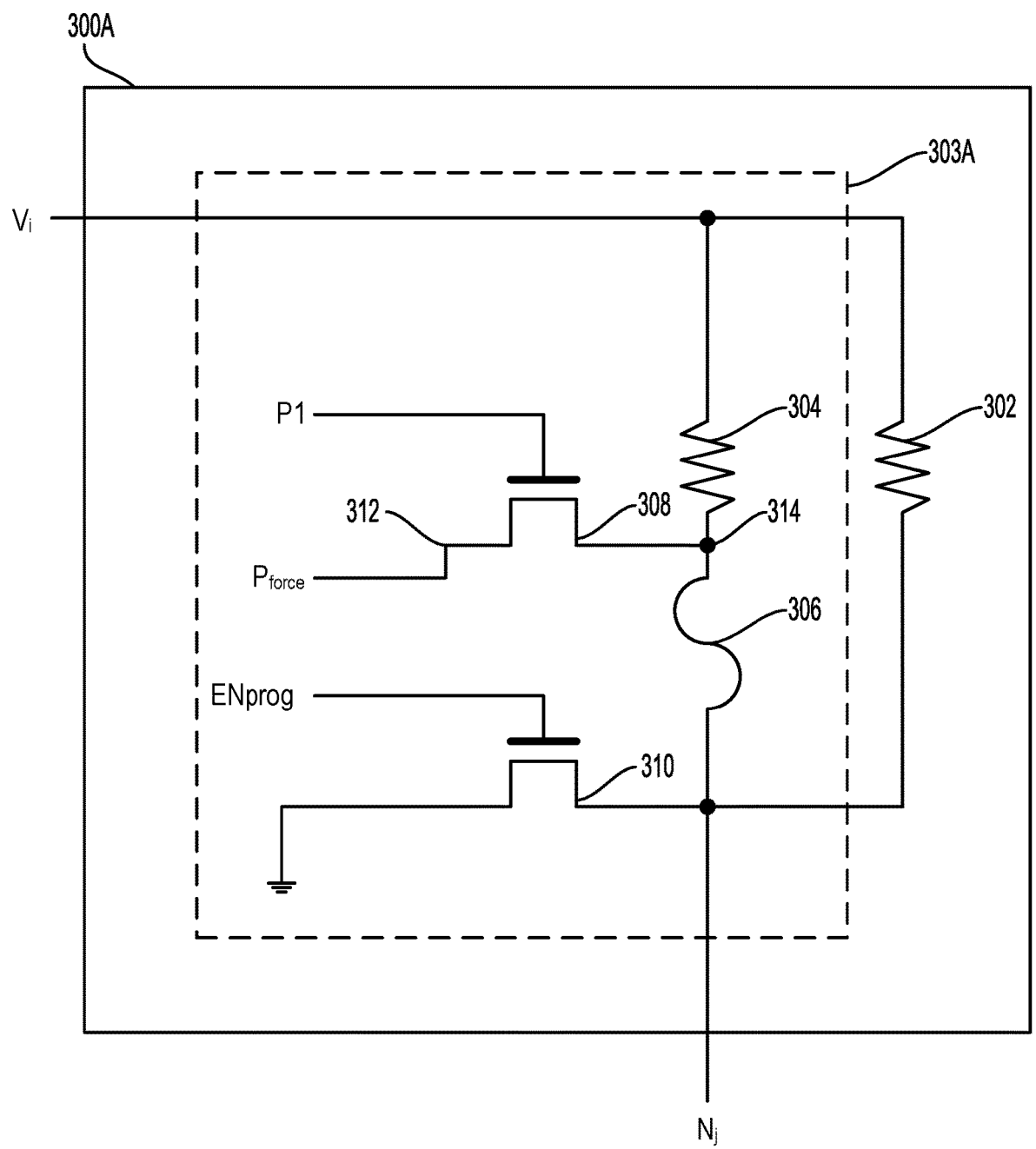
FIG. 3A illustrates an example programmable circuit including a main resistor and an auxiliary resistor used to implement a weight parameter of a machine learning model, according to aspects of the present disclosure.

FIG. 3A illustrates an example programmable circuit 300A that uses a resistor array with a main resistor and an auxiliary resistor to implement a weight value for a machine learning model. Programmable circuit 300A may correspond to any programmable circuit 202 illustrated in FIG. 2. Programmable circuit 300A may use standard electrical components, such as metal resistors, programmable fuses, and transistors, which, as discussed above, may facilitate the implementation of programmable circuit 300A (or arrays thereof) in other integrated circuits, such as CPUs or SOCs. As illustrated, programmable circuit 300A includes a main resistor 302 and an auxiliary resistor circuit 303A. As illustrated, auxiliary resistor circuit 303A may include an auxiliary resistor 304, a programmable fuse 306 (e.g., an eFuse), a fuse programming switch 308, and a programming-enable switch 310. As discussed in further detail below, auxiliary resistor circuit 303A may be selectively programmed to implement varying weight values in a machine learning model as a combination of the resistance of the main resistor 302 and the auxiliary resistor 304.

Main resistor 302 and auxiliary resistor 304 included as part of an auxiliary resistor circuit 303A may be established in parallel to use the combined resistance of main resistor 302 and the auxiliary resistor 304 to implement a weight value in a machine learning model. Main resistor 302 may, in some aspects, comprise a high resistance resistor, and the auxiliary resistor 304 may comprise a high resistance or low resistance resistor. In some aspects, main resistor 302 and auxiliary resistor 304 may comprise resistors having approximately equal resistance. Using resistors with approximately equal resistance for both main resistor 302 and auxiliary resistor 304 provides increased adjustment range in the weights programmed into each programmable circuit 300A, compared to resistors with resistances different by one or more orders of magnitude. The main resistor 302 and/or the auxiliary resistor 304 may be implemented as precision metal resistors.

Programmable circuit 300A generally generates a current output as a sum of the currents passed through main resistor 302 and potentially through auxiliary resistor 304. For a weight value that does not substantially modify the value of an input, programmable circuit 300A may be programmed to decouple the auxiliary resistor 304 from main resistor 302 such that the current output of programmable circuit 300A is unchanged or minimally changed, due to the fact that the total resistance of programmable circuit 300A in this case is equal to the resistance of main resistor 302. For weight values that modify the value of an input, programmable circuit 300A may be programmed such that the main resistor 302 and the auxiliary resistor 304 are electrically coupled in parallel to generate an output value. By coupling the main resistor 302 and auxiliary resistor 304 in parallel, the output current $N_j$ may be calculated according to the equation:

$$N_j = \frac{V_i}{\text{total resistance}},$$

where the total resistance is the parallel combination of the resistances of main resistor 302 and auxiliary resistor 304, having a smaller value than any individual resistor in the parallel combination and therefore leading to a relatively larger output current $N_j$.

To program programmable circuit 300A, programming-enable switch 310 may be switched to a programming state (e.g., activated with a closed switch), and fuse programming switch 308 may be set to apply a voltage to programmable fuse 306 within auxiliary resistor circuit 303A. Programming-enable switch 310 may be switched to a programming state, for example, by inputting a control signal ENprog into programming-enable switch 310 to selectively enable programming of the auxiliary resistor circuit 303A. Fuse programming switch 308 may be coupled between a first node 312 and a second node 314. To program programmable fuse 306 (e.g., selectively blow fuse 306 and decouple auxiliary resistor 304 from programmable circuit 300A), a control signal P1 may be input into fuse programming switch 308 to allow a voltage $P_{force}$ to be applied to programmable fuse 306. The voltage $P_{force}$ may be input into fuse programming switch 308 through first node 312 and selectively applied to programmable fuse 306 through second node 314. Generally, placing programming-enable switch 310 into a programming state and turning on the P1 control signal allows a programming current to flow through fuse programming switch 308, programmable fuse 306, and programming-enable switch 310 out to a reference potential node (e.g., electrical ground) for the programmable circuit 300A. The voltage $P_{force}$, when applied to the programmable fuse 306 through fuse programming switch 308, may be sufficient to blow programmable fuse 306 and electrically decouple auxiliary resistor 304 from main resistor 302. The voltage $P_{force}$ may be a power supply voltage, for example. In some aspects, a voltage may also be applied to programmable fuse 306, through fuse programming switch 308, to reverse blow the fuse and re-couple auxiliary resistor 304 to main resistor 302.

Figure 3B:
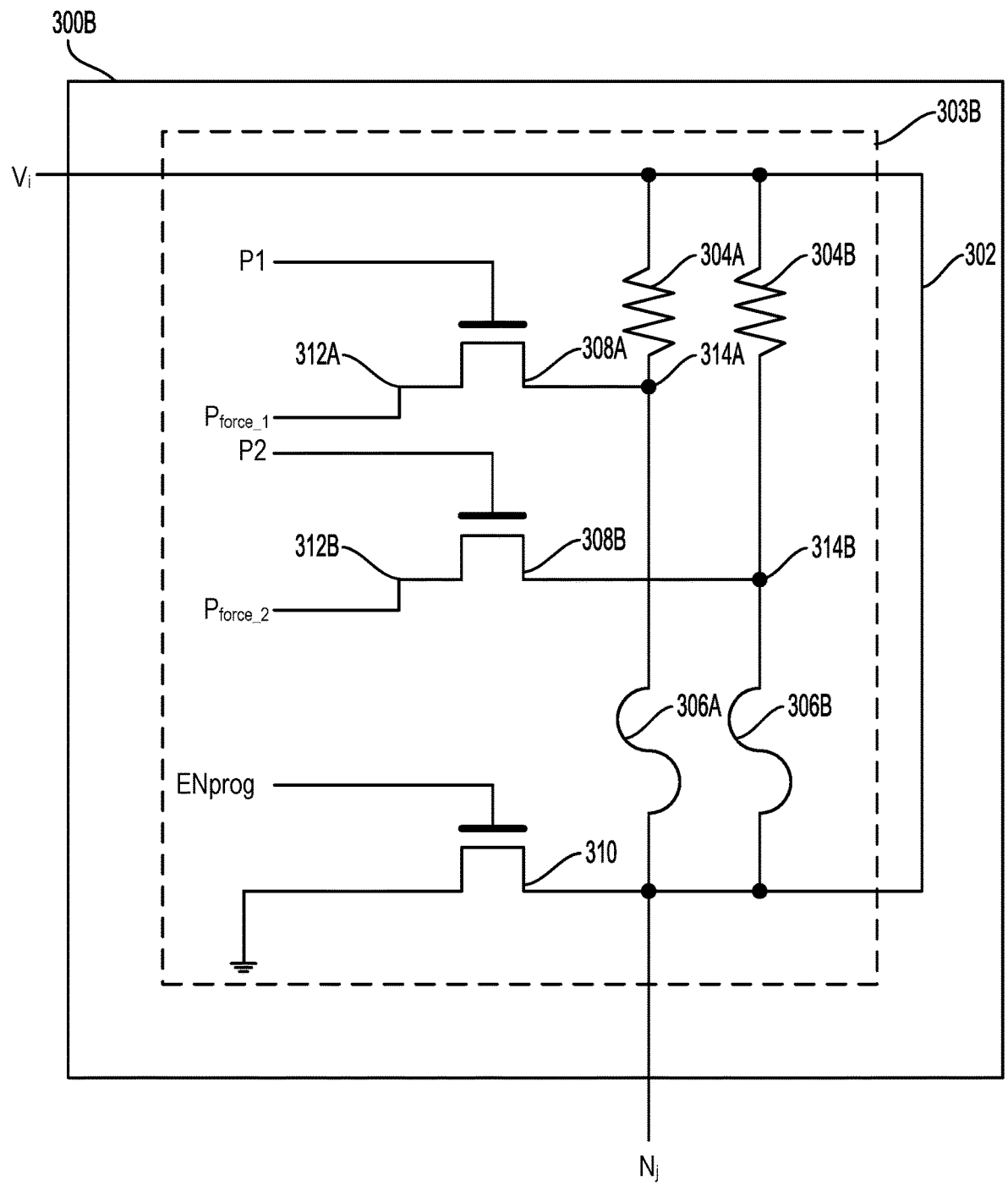
FIG. 3B illustrates an example programmable circuit including a main resistor and a plurality of auxiliary resistors used to implement a weight parameter of a machine learning model, according to aspects of the present disclosure.

FIG. 3B illustrates an example programmable circuit 300B including a plurality of auxiliary resistors in an auxiliary resistor circuit 303B. Programmable circuit 300B may correspond to any programmable circuit 202 illustrated in FIG. 2. As illustrated, programming-enable switch 310 and fuse programming switches 308A and 308B may be operative to program the programmable circuit 300B by electrically coupling or decoupling auxiliary resistors 304A and 304B, respectively, from main resistor 302. Although only two auxiliary resistors 304 and 304B are illustrated in FIG. 3B, the reader is to understand that some aspects may include more than two auxiliary resistors selectively coupled in parallel. However, for ease of describing and illustrating the concepts, the following description will utilize two auxiliary resistors.

When programming-enable switch 310 is switched to a programming state (e.g., via the application of the ENprog control signal to programming-enable switch 310), fuse programming switch 308A may be set (e.g., via application of the P1 signal to fuse programming switch 308A) to apply the voltage $P_{force\_1}$ at node 312A to fuse 306A through second node 314A. Separately, fuse programming switch 308B may be set (e.g., via application of the P2 signal to fuse programming switch 308B) to apply the voltage $P_{force\_2}$ at node 312B to fuse 306B through second node 314B. As discussed, the voltages $P_{force\_1}$ and $P_{force\_2}$ may be used to blow fuses 306A and 306B, respectively, which may electrically decouple auxiliary resistors 304 in auxiliary resistor circuit 303B from main resistor 302, or may be used to reverse blow fuses 306A and 306B to electrically couple auxiliary resistors 304A and 304B in the auxiliary resistor circuit 303B in parallel with main resistor 302. While FIG. 3B illustrates that fuses 306A and 306B may be individually selectively blown by turning on programming-enable switch 310 and the respective fuse programming switch 308A and/or 308B, it should be recognized that programmable fuses 306 may be collectively blown using a single fuse programming switch 308 (e.g., to decouple all of the auxiliary resistors 304 in auxiliary resistor circuit 303B from main resistor 302 based on a weight value to be implemented by programmable circuit 300B).

In some aspects, a number of the auxiliary resistors 304 electrically coupled to the main resistor 302 may correspond to a number of bits used for a weight value. For example, a two-bit weight value may be implemented in programmable circuit 300A using a main resistor 302 and a single auxiliary resistor 304, a three-bit weight value may be implemented in programmable circuit 300B using a main resistor 302 and two auxiliary resistors 304A and 304B, and so on.

To operate programmable circuit 300 to perform a machine learning operation, fuse programming switch 308 and programming-enable switch 310 may be turned off (e.g., deactivated with an open switch). Turning off fuse programming switch 308 and programming-enable switch 310 enables programmable circuit 300 to receive an electrical input representative of a feature vector or other input on which a machine learning operation is to be performed, pass the electrical input through main resistor 302 and any coupled auxiliary resistors 304, and generate an output value as the combination of the output of main resistor 302 and any auxiliary resistors 304 coupled in parallel with the main resistor 302.

Figure 4:
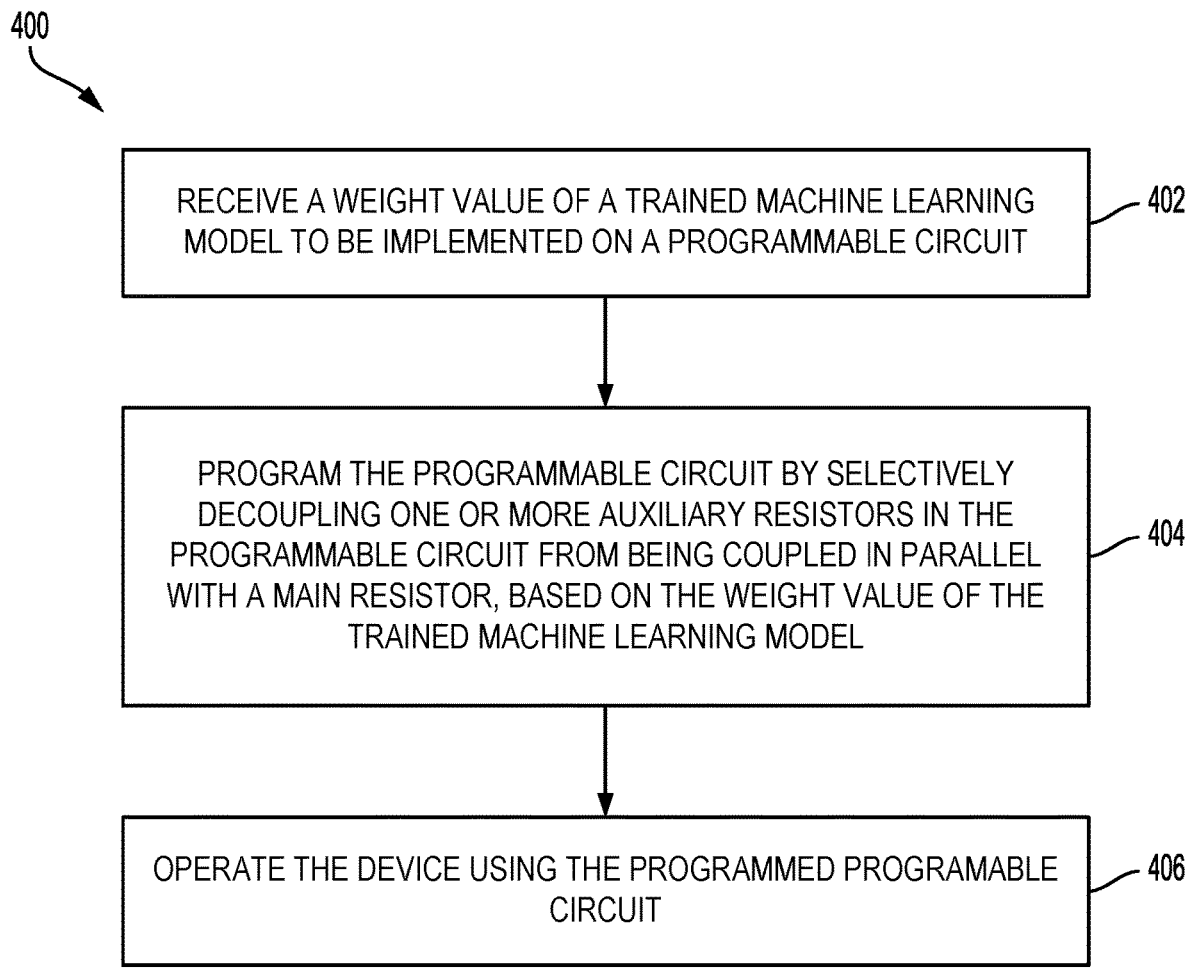
FIG. 4 illustrates example operations for performing machine learning operations on a device having a programmable circuit, according to aspects of the present disclosure.

FIG. 4 illustrates example operations 400 that may be performed by a device having a programmable circuit to perform machine learning operations, according to aspects of the present disclosure. As illustrated, operations 400 begin at block 402, where a device receives, from a server, a weight value of a trained machine learning model to be implemented on the programmable circuit. As discussed, the weight value may be generated by the server by processing a training data set on the server so that a machine learning model can be deployed on an edge device without involving the edge device in training the machine learning model.

At block 404, the device programs the programmable circuit by selectively decoupling one or more auxiliary resistors from being coupled in parallel with a main resistor, based on the weight value of the trained machine learning model. To selectively decouple the one or more auxiliary resistors, the device can activate a programming-enable switch in the programmable circuit to switch the circuit to write mode and activate a fuse programming switch in the programmable circuit to allow a voltage to be applied to the programmable fuse that is sufficient to blow the programmable fuse and cause the auxiliary resistor to which the programmable fuse is coupled to become electrically decoupled from the main resistor in the programmable circuit. When the programmable circuit is programmed, the device can exit a programming mode by opening (turning off) the programming-enable switch and fuse programming switch, allowing other inputs to flow into the programmable circuit for processing.

At block 406, the system operates the device using the programmed programmable circuit. To operate the device using the programmed programmable circuit, the system may receive data to perform a machine learning operation on. The data may, for example, be a bitstream corresponding to a captured image, audio, textual data, etc. The system may convert the bitstream into an analog signal, input the analog signal to the programmed programmable circuit, and receive an output signal from the programmed programmable circuit representing the results of performing the machine learning operation on the input signal.

According to some aspects, selectively decoupling one or more auxiliary resistors in the programmable circuit includes selectively blowing one or more programmable fuses so as to electrically decouple the one or more auxiliary resistors in the programmable circuit from the main resistor in the programmable circuit. Each of the programmable fuses may be coupled in series with an auxiliary resistor of the one or more auxiliary resistors (e.g., in auxiliary resistor circuit 303A). According to some aspects, selectively blowing the one or more programmable fuses may include selectively closing (activating or turning on) one or more switches, each switch coupled between a first node coupled to a voltage source and a second node coupled to the auxiliary resistor and the programmable fuse.

According to some aspects, the system may further reprogram the programmable circuit based on an updated weight value for the trained machine learning model.

According to some aspects, the system may further reprogram the programmable circuit to implement a different machine learning model.

According to some aspects, operating the device using the programmable circuit comprises receiving an input comprising a feature vector represented as an analog input. An output may be generated based on a product of an element of the feature vector and a resistance of the main resistor and the one or more auxiliary resistors coupled to the main resistor.

According to some aspects, a number of the one or more auxiliary resistors in the circuit corresponds to a number of bits of precision associated with the weight value.

According to some aspects, operating the device using the programmed programmable circuit comprises using an output of the programmable circuit in conjunction with an output of one or more other programmable circuits in a multiply and accumulate operation.

According to some aspects, the trained machine learning model is based on a deep neural network trained to perform a specific task.

According to some aspects, the device may comprise a mobile computing device. According to some aspects, the device may comprise an autonomous motor vehicle.

Figure 5:
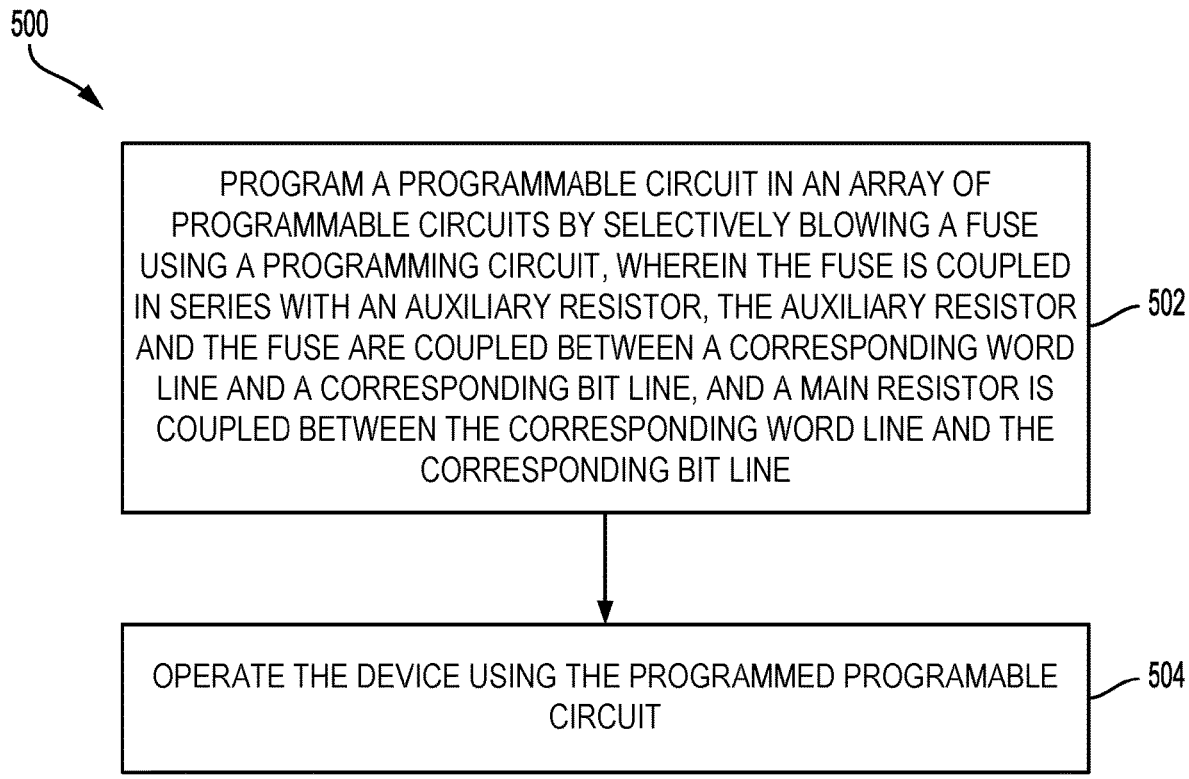
FIG. 5 illustrates example operations for programming a programmable circuit to adjust a resistance of the programmable circuit, according to aspects of the present disclosure.

FIG. 5 illustrates example operations 500 that may be performed to program a device, according to aspects of the present disclosure. As discussed, the device may have a plurality of word lines, a plurality of bit lines, and an array of programmable circuits. Each programmable circuit in the array of programmable circuits may be coupled to a corresponding word line in the plurality of word lines and a corresponding bit line in the plurality of bit lines. Programming a programmable circuit may modify the total resistance of the programmable circuit by selectively coupling or decoupling auxiliary resistors in series to a main resistor.

As illustrated, operations 500 begin at block 502, where a device programs a programmable circuit in an array of programmable circuits by selectively blowing a fuse using a programming circuit. The fuse may be coupled in series with an auxiliary resistor, and the auxiliary resistor and fuse may be coupled between the corresponding word line and the corresponding bit line. A main resistor may also be coupled between the corresponding word line and the corresponding bit line. To program the programmable circuit, the device selectively blows the fuse using a programming circuit. By selectively blowing the fuse coupled with the auxiliary resistor, the device decouples the auxiliary resistor from a main resistor in the programmable circuit. Once decoupled, the auxiliary resistor may no longer be coupled between the word line and the bit line, thereby adjusting a total resistance of the programmable circuit to be a combination of the resistance of the main resistor and auxiliary resistors (if any) that are still coupled with the main resistor in series.

At block 504, the system operates the device using the programmed programmable circuit. To operate the device using the programmed programmable circuit, the system may receive data to perform a machine learning operation on. The data may, for example, be a bitstream corresponding to a captured image, audio, textual data, etc. The system may convert the bitstream into an analog signal, input the analog signal to the programmed programmable circuit, and receive an output signal from the programmed programmable circuit representing the results of performing the machine learning operation on the input signal.

Figure 6:
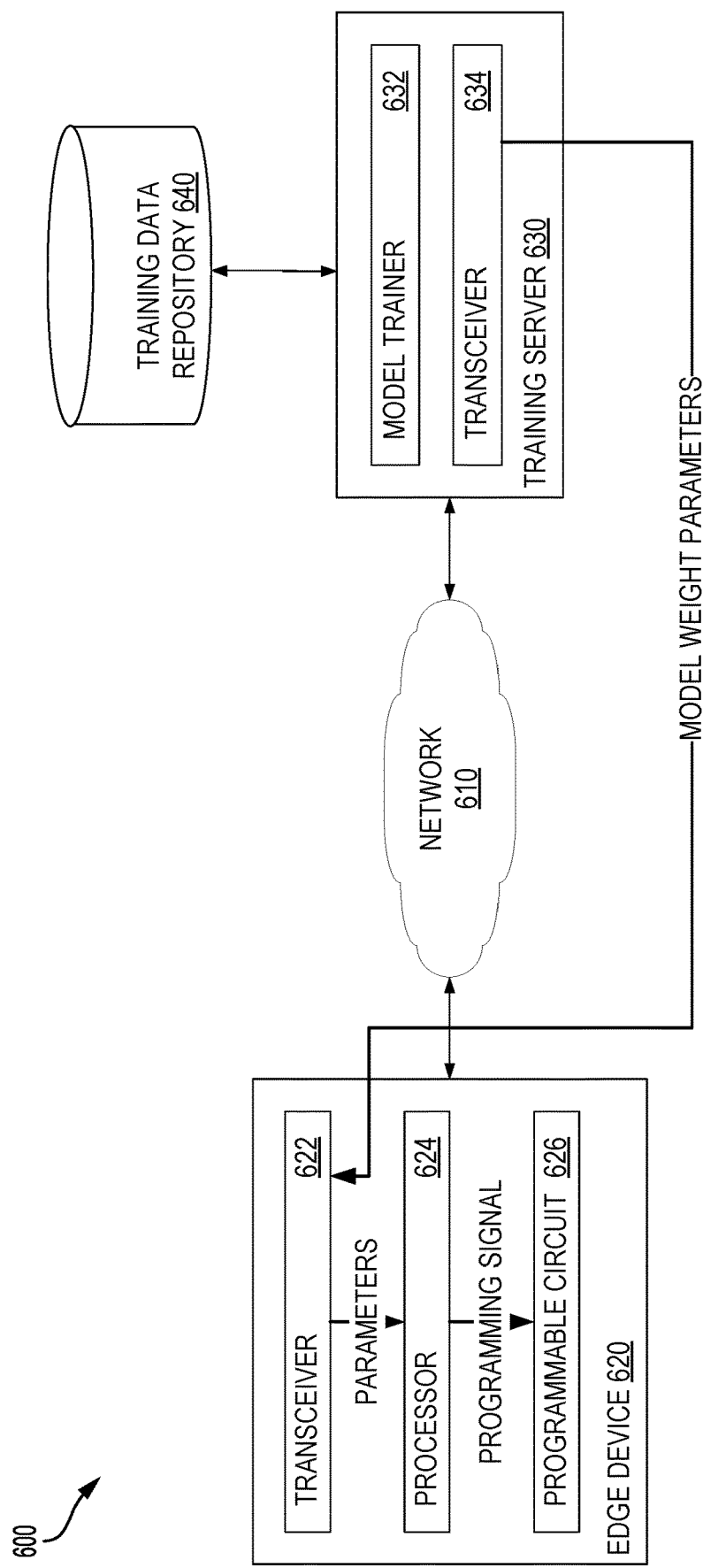
FIG. 6 illustrates an example networked environment in which a programmable circuit in an edge device is programmed to implement a trained machine learning model, according to aspects of the present disclosure.

FIG. 6 illustrates an example networked environment in which an edge device having an array of programmable circuits may be programmed to implement a machine learning model by a server. As illustrated, networked environment 600 includes an edge device 620, a training server 630, and a training data repository 640, at least the edge device 620 and the training server 630 being connected via a network 610.

Edge device 620 may represent a device on which a machine learning operation, such as object recognition from an image or series of captured images, is to be performed. Edge device 620 may include, for example, a mobile phone, a tablet computer, a laptop or desktop computer, an autonomous motor vehicle, or other device on which machine learning operations may be executed. Because the edge devices 620 may be computing resource or power constrained, it may not be practical to train a machine learning model on these devices; however, a trained machine learning model may be executed on these devices.

As illustrated, edge device 620 includes a transceiver 622, a processor 624, and a programmable circuit 626. Transceiver 622 generally receives information from a training server 630 including model weight parameters to be implemented in a programmable circuit 626 in order to execute a machine learning operation on edge device 620. Transceiver 622 passes the parameters to processor 624, which may generate a programming signal and input the programming signal to programmable circuit 626 (e.g., implemented as shown in the programmable circuit 300A of FIG. 3A). As discussed above, the programming signal may comprise voltages applied to a fuse programming switch and a programming-enable switch to switch programmable circuit 626 into a programming mode and selectively decouple one or more auxiliary resistors from a primary resistor in the programmable circuit 626. After the programmable circuit has been programmed, processor 624 may switch programmable circuit 626 to an operational mode, obtain data on which to perform a machine learning operation, and pass the obtained data to the programmed programmable circuit 626 for processing.

Training server 630 generally represents a server, cluster of servers, cloud computing instances, or other computing devices on which a machine learning model may be trained for deployment on edge device 620. As illustrated, training server 630 includes a model trainer 632 and a transceiver 634. Model trainer 632 may be configured to train a machine learning model using unsupervised, semi-supervised, or fully supervised machine learning techniques based on a set of data retrieved from training data repository 640. Unsupervised learning techniques may be executed against a raw, unannotated training data set from training data repository 640. Semi-supervised learning techniques may be executed against a training data set from training data repository 640 including a labeled set of data and an unlabeled set of data that may be used to verify the machine learning model. Supervised learning techniques may be executed against a labeled set of training data from training data repository 640.

After model trainer 632 has trained a machine learning model (e.g., determined the weights to apply to data input into the machine learning model), training server 630 can output information about the machine learning model through transceiver 634 to one or more edge devices 620 and instruct the edge devices 620 to program a programmable circuit 626 according to the output information. Additional information may be output through transceiver 634 over time, for example, to update the machine learning model deployed on the edge devices 620 and/or implement new machine learning models on the edge devices 620.

Figure 7:
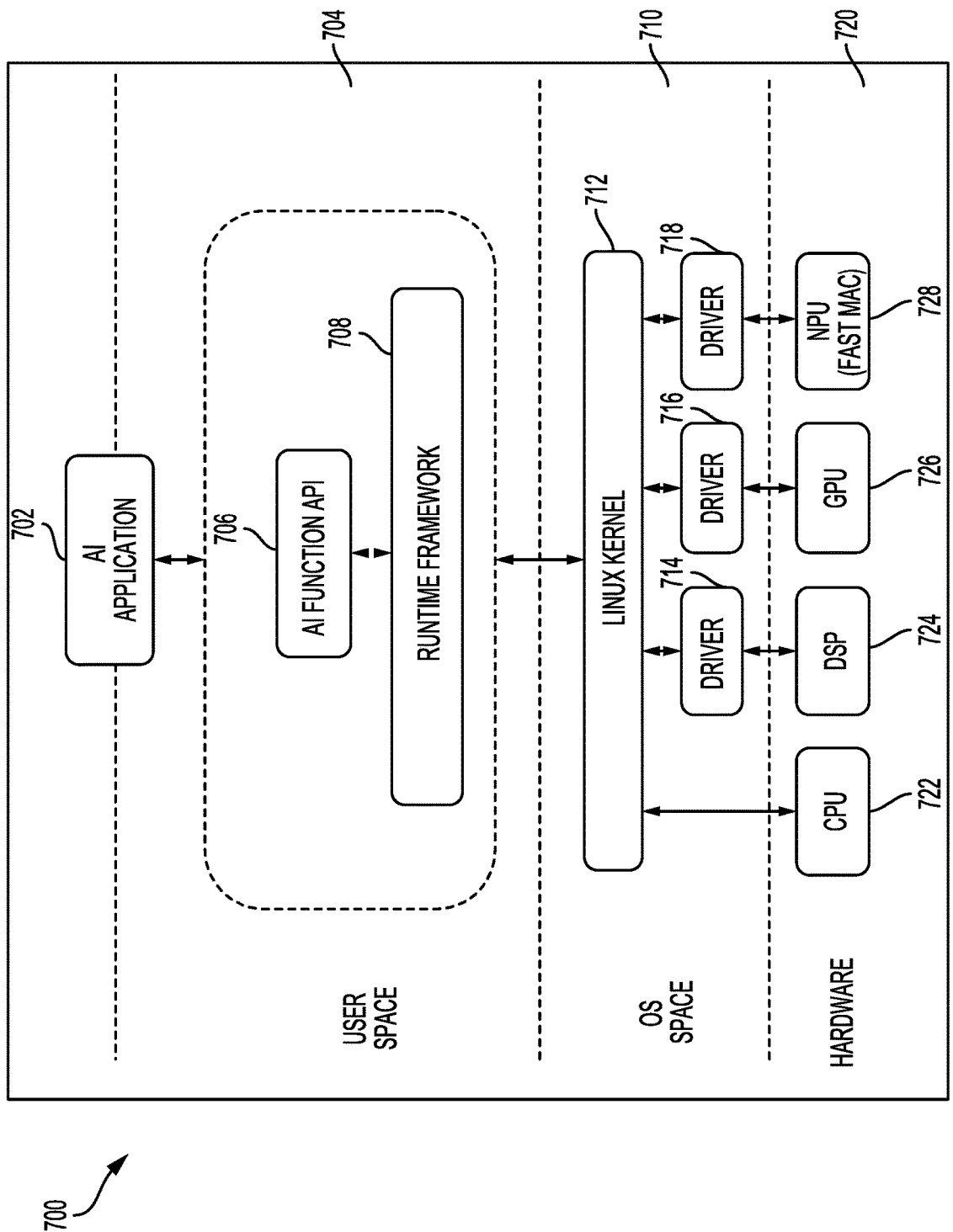
FIG. 7 shows a block diagram illustrating an exemplary software architecture for modularizing artificial intelligence (AI) functions, according to aspects of the present disclosure.

FIG. 7 is a block diagram illustrating an exemplary software architecture 700 that may modularize artificial intelligence (AI) functions. Using architecture 700, applications may be designed that may cause various processing blocks of an SOC 720 (for example a CPU 722, a DSP 724, a GPU 726, and/or an NPU 728) to support video compression and/or decompression using deep generative models, according to aspects of the present disclosure.

The AI application 702 may be configured to call functions defined in a user space 704 that may, for example, compress and/or decompress video signals (or encoded versions thereof) using deep generative models. The AI application 702 may, for example, configure a microphone and a camera differently depending on whether the recognized scene is an office, a lecture hall, a restaurant, or an outdoor setting such as a lake. The AI application 702 may make a request to compile program code associated with a library defined in an AI function application programming interface (API) 706. This request may ultimately rely on the output of a deep neural network configured to provide an inference response based on video and positioning data, for example.

A run-time engine 708, which may be compiled code of a runtime framework, may be further accessible to the AI application 702. The AI application 702 may cause the run-time engine, for example, to request an inference at a particular time interval or triggered by an event detected by the user interface of the application. When caused to provide an inference response, the run-time engine may in turn send a signal to an operating system in an operating system (OS) space 710, such as a Linux Kernel 712, running on the SOC 720. The operating system, in turn, may cause video compression and/or decompression using deep generative models to be performed on the CPU 722, the DSP 724, the GPU 726, the NPU 728, or some combination thereof. The CPU 722 may be accessed directly by the operating system, and other processing blocks may be accessed through a driver, such as a driver 714, 716, or 718 for, respectively, the DSP 724, the GPU 726, or the NPU 728. In the exemplary example, the deep neural network may be configured to run on a combination of processing blocks, such as the CPU 722, the DSP 724, and the GPU 726, or may be run on the NPU 728.

Means for receiving may comprise, for example, a transceiver (e.g., connectivity block 110 illustrated in FIG. 1 and/or transceiver 522 illustrated in FIG. 5). Means for programming and means for reprogramming may comprise a processor—such as CPU 102, GPU 104, DSP 106, or NPU 108 illustrated in FIG. 1 and/or processor 624 illustrated in FIG. 6—and/or switches, such as switch 308, 308A, 308B, and/or 310 in FIGS. 3A and 3B. Means for operating may comprise a processor, such as CPU 102, GPU 104, DSP 106, or NPU 108 illustrated in FIG. 1 and/or processor 624 illustrated in FIG. 6. Means for generating may comprise a programmable circuit 300A or 300B illustrated in FIG. 3A or 3B and/or an array 200 of programmable circuits illustrated in FIG. 2.

The various illustrative circuits described in connection with aspects described herein may be implemented in or with an integrated circuit (IC), such as a processor, a digital signal processor (DSP), an application-specific integrated circuit (ASIC), a field-programmable gate array (FPGA), or other programmable logic device. A processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

It is also noted that the operational steps described in any of the exemplary aspects herein are described to provide examples. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flow diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The present disclosure is provided to enable any person skilled in the art to make or use aspects of the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. An apparatus, comprising:
   a plurality of word lines;
   a plurality of bit lines; and
   an array of programmable circuits, wherein each programmable circuit is coupled to a corresponding word line in the plurality of word lines and to a corresponding bit line in the plurality of bit lines and comprises:
      a main resistor coupled between the corresponding word line and the corresponding bit line,
      an auxiliary resistor,
      a fuse coupled in series with the auxiliary resistor, wherein the auxiliary resistor and the fuse are coupled between the corresponding word line and the corresponding bit line, and
      a programming circuit configured to selectively blow the fuse.

2. The apparatus of claim 1, wherein:
   the programmable circuit further comprises at least one additional auxiliary resistor coupled to at least one additional fuse, the at least one additional auxiliary resistor and the at least one additional fuse being connected in series, and
   the programming circuit is configured to selectively blow one or more of the fuse and the at least one additional fuse.

3. The apparatus of claim 1, wherein the programmable circuit further comprises one or more switches, each switch being coupled between a first node coupled to a voltage source and a second node coupled to the auxiliary resistor and the fuse.

4. The apparatus of claim 1, further comprising a processor configured to:
   reprogram at least one of the programmable circuits in the array based on an updated weight value for a trained machine learning model.

5. The apparatus of claim 1, further comprising a processor configured to:
   reprogram at least one of the programmable circuits in the array to implement a different machine learning model.

6. The apparatus of claim 1, wherein a number of auxiliary resistors in each programmable circuit corresponds to a number of bits of precision associated with weight values of a trained machine learning model.

7. The apparatus of claim 1, wherein an output of each programmable circuit in the array of programmable circuits is used in a multiply and accumulate operation.

8. The apparatus of claim 1, wherein the array of programmable circuits is configured to execute a trained machine learning model, and wherein the trained machine learning model is based on a deep neural network trained to perform a specific task.

9. The apparatus of claim 1, wherein the apparatus is a mobile computing device.

10. The apparatus of claim 1, wherein the apparatus is an autonomous motor vehicle.

11. A method for programming a device having a plurality of word lines, a plurality of bit lines, and an array of programmable circuits, wherein each programmable circuit is coupled to a corresponding word line in the plurality of word lines and to a corresponding bit line in the plurality of bit lines, the method comprising:
    programming a programmable circuit in the array of programmable circuits by selectively blowing a fuse, wherein:
       the fuse is coupled in series with an auxiliary resistor,
       the auxiliary resistor and the fuse are coupled between the corresponding word line and the corresponding bit line, and
       a main resistor is coupled between the corresponding word line and the corresponding bit line; and
    operating the device using the programmed programmable circuit.

12. The method of claim 11, wherein the selectively blowing the fuse comprises selectively blowing one or more of the fuse coupled with the auxiliary resistor and at least one additional fuse coupled to at least one additional auxiliary resistor, the at least one additional fuse and the at least one additional auxiliary resistor being connected in series.

13. The method of claim 12, wherein the selectively blowing the fuse comprises selectively closing one or more switches, each switch being coupled between a first node coupled to a voltage source and a second node coupled to the auxiliary resistor and the fuse.

14. The method of claim 11, wherein the programmable circuit is programmed to implement a trained machine learning model and is programmed based on a weight value for the trained machine learning model.

15. The method of claim 14, further comprising reprogramming the programmable circuit based on an updated weight value for the trained machine learning model.

16. The method of claim 14, further comprising reprogramming the programmable circuit to implement a different machine learning model.

17. The method of claim 14, wherein the trained machine learning model is based on a deep neural network trained to perform a specific task.

18. The method of claim 14, wherein a number of auxiliary resistors in the programmable circuit corresponds to a number of bits of precision associated with the weight value of the trained machine learning model.

19. The method of claim 11, wherein the operating the device using the programmable circuit comprises:
    receiving an input comprising a feature vector represented as an analog input; and
    generating an output based on a product of an element of the feature vector and a resistance of the main resistor and the auxiliary resistor.

20. The method of claim 11, wherein the operating comprises using an output of the programmable circuit in conjunction with an output of one or more other programmable circuits in the array of programmable circuits in a multiply and accumulate operation.

21. The method of claim 11, wherein the device comprises one of a mobile computing device or an autonomous motor vehicle.

22. An apparatus for programming a device, comprising:
    a plurality of word lines;
    a plurality of bit lines;
    an array of programmable circuits, wherein each programmable circuit is coupled to a corresponding word line in the plurality of word lines and to a corresponding bit line in the plurality of bit lines;

means for programming a programmable circuit in the array of programmable circuits by selectively blowing a fuse using the means for programming, wherein:

the fuse is coupled in series with an auxiliary resistor, the auxiliary resistor and the fuse are coupled between the corresponding word line and the corresponding bit line, and a main resistor is coupled between the corresponding word line and the corresponding bit line; and means for operating the apparatus using the programmed programmable circuit.

23. The apparatus of claim 22, wherein the means for programming is configured to selectively blow one or more of the fuse coupled with the auxiliary resistor and at least one additional fuse coupled to at least one additional auxiliary resistor, the at least one additional fuse and the at least one additional auxiliary resistor being connected in series.

24. The apparatus of claim 23, wherein the means for programming is configured to selectively blow the fuse by closing one or more switches, each switch being coupled between a first node coupled to a voltage source and a second node coupled to the auxiliary resistor and the fuse.

25. The apparatus of claim 22, wherein the programmable circuit is programmed to implement a trained machine learning model, wherein the programmable circuit is programmed based on a weight value for the trained machine learning model, and wherein the apparatus further comprises means for reprogramming the programmable circuit based on an updated weight value for the trained machine learning model.

26. The apparatus of claim 22, wherein the programmable circuit is programmed to implement a trained machine learning model and wherein the apparatus further comprises means for reprogramming the programmable circuit to implement a different machine learning model.

27. The apparatus of claim 22, wherein the means for operating the apparatus using the programmed programmable circuit comprises:

means for receiving an input comprising a feature vector represented as an analog input; and means for generating an output based on a product of an element of the feature vector and a resistance of the main resistor and the auxiliary resistor.

28. The apparatus of claim 22, wherein the programmable circuit is programmed to implement a trained machine learning model, wherein the programmable circuit is programmed based on a weight value for the trained machine learning model, and wherein a number of auxiliary resistors in the programmable circuit corresponds to a number of bits of precision associated with the weight value for the trained machine learning model.

29. The apparatus of claim 22, wherein the means for operating comprises means for using an output of the programmable circuit in conjunction with an output of one or more other programmable circuits in the array of programmable circuits in a multiply and accumulate operation.

30. A non-transitory computer-readable medium having instructions stored thereon which, when executed by a processor, performs an operation for programming a device comprising the processor, a plurality of word lines, a plurality of bit lines, and an array of programmable circuits, wherein each programmable circuit is coupled to a corresponding word line in the plurality of word lines and to a corresponding bit line in the plurality of bit lines, the operation comprising:

programming a programmable circuit in the array of programmable circuits by selectively blowing a fuse, wherein:

the fuse is coupled in series with an auxiliary resistor, the auxiliary resistor and the fuse are coupled between the corresponding word line and the corresponding bit line, and a main resistor is coupled between the corresponding word line and the corresponding bit line; and operating the device using the programmed programmable circuit.

* * * * *